(12) United States Patent
Kanagawa

(10) Patent No.: US 11,619,361 B2
(45) Date of Patent: Apr. 4, 2023

(54) VEHICLE LUMINAIRE AND VEHICLE LAMP

(71) Applicant: Toshiba Lighting & Technology Corporation, Yokosuka (JP)

(72) Inventor: Hiroaki Kanagawa, Ehime-ken (JP)

(73) Assignee: Toshiba Lighting & Technology Corporation, Yokosuka (JP)

( * ) Notice: Subject to any disclaimer, the term of this patent is extended or adjusted under 35 U.S.C. 154(b) by 0 days.

(21) Appl. No.: 17/592,662

(22) Filed: Feb. 4, 2022

(65) Prior Publication Data

US 2022/0307666 A1    Sep. 29, 2022

(30) Foreign Application Priority Data

Mar. 23, 2021   (JP) .............................. JP2021-048474

(51) Int. Cl.
| | | |
|---|---|---|
| F21S 41/143 | (2018.01) | |
| F21V 23/00 | (2015.01) | |
| H05K 3/36 | (2006.01) | |

(52) U.S. Cl.
CPC .......... *F21S 41/143* (2018.01); *F21V 23/006* (2013.01); *H05K 3/366* (2013.01)

(58) Field of Classification Search
CPC ....... F21S 41/143; F21V 23/006; H05K 3/366
See application file for complete search history.

(56) References Cited

U.S. PATENT DOCUMENTS

| | | | | |
|---|---|---|---|---|
| 8,500,301 | B2 * | 8/2013 | Duan ................... | F21V 17/164 362/235 |
| 10,563,837 | B2 * | 2/2020 | Lee ......................... | B60Q 3/51 |
| 2009/0059594 | A1 * | 3/2009 | Lin ......................... | F21S 45/46 362/294 |
| 2013/0114251 | A1 | 5/2013 | Duan | |
| 2015/0117037 | A1 * | 4/2015 | Fan ........................ | F21K 9/238 362/362 |

(Continued)

FOREIGN PATENT DOCUMENTS

| | | |
|---|---|---|
| DE | 102013214236 A1 | 1/2015 |
| EP | 2787798 A2 | 10/2014 |

(Continued)

OTHER PUBLICATIONS

EvanDesigns, "What is that bridge rectifier on the LEDs for?", Sep. 26, 2020 (Year: 2020).*

*Primary Examiner* — Matthew J. Peerce
(74) *Attorney, Agent, or Firm* — Banner & Witcoff, Ltd.

(57) ABSTRACT

A vehicle luminaire includes: a board having a plate shape and including a first surface, a second surface facing the first surface, and at least one coupling portion penetrating between the first surface and the second surface; a light-emitting element provided on the first surface of the board; and a connecting portion having a plate shape, including a convex portion provided inside each coupling portion on one end portion side, and extending in a direction from the first surface toward the second surface. A tip portion of the convex portion may protrude from the first surface of the board. A distance between the tip portion of the convex portion and the first surface of the board may be larger than a distance between a light-emitting surface of the light-emitting element and the first surface of the board.

17 Claims, 3 Drawing Sheets

(56) References Cited

U.S. PATENT DOCUMENTS

2018/0063920 A1* 3/2018 Weber .................. H02M 3/1582
2021/0364143 A1* 11/2021 Hino ....................... F21S 45/47

FOREIGN PATENT DOCUMENTS

| EP | 3242073 A1 | 11/2017 |
|----|------------|---------|
| JP | 2013-105652 A | 5/2013 |
| KR | 10-2017-0064433 A | 6/2017 |

* cited by examiner

VEHICLE LUMINAIRE AND VEHICLE LAMP

CROSS-REFERENCE TO RELATED APPLICATIONS

This application is based upon and claims the benefit of priority from Japanese Patent Application No. 2021-048474, filed on Mar. 23, 2021; the entire contents of which are incorporated herein by reference.

FIELD

Embodiments described herein relate generally to a vehicle luminaire and a vehicle lamp.

BACKGROUND

A wedge base bulb without a cap is used as a vehicle luminaire. The wedge base bulb is an incandescent lamp. Therefore, from viewpoints of power saving, elongation of a service life, and the like, the wedge base bulb is replaced with a vehicle luminaire including a light-emitting diode.

The wedge base bulb is mounted so as to be pushed into a socket provided in a vehicle lamp. When the vehicle luminaire device including the light-emitting diode is used instead of the wedge base bulb, it is preferable that the socket to which the wedge base bulb is mounted can be used directly.

Therefore, there has been proposed a vehicle luminaire including a board on which a light-emitting diode is mounted and a housing extending in a direction perpendicular to a surface of the board on an opposite side from the light-emitting diode side. The housing is provided with a pair of leads (terminals). When such a vehicle luminaire is mounted in the socket, an operator grasps a peripheral edge of the board on which the light-emitting diode is mounted. At this time, when the operator touches a light-emitting surface of the light-emitting diode, the light-emitting diode may fail.

Therefore, it has been desired to develop a technique capable of preventing an external force from being applied to a light-emitting element such as the light-emitting diode.

DETAILED DESCRIPTION

Figure 1:
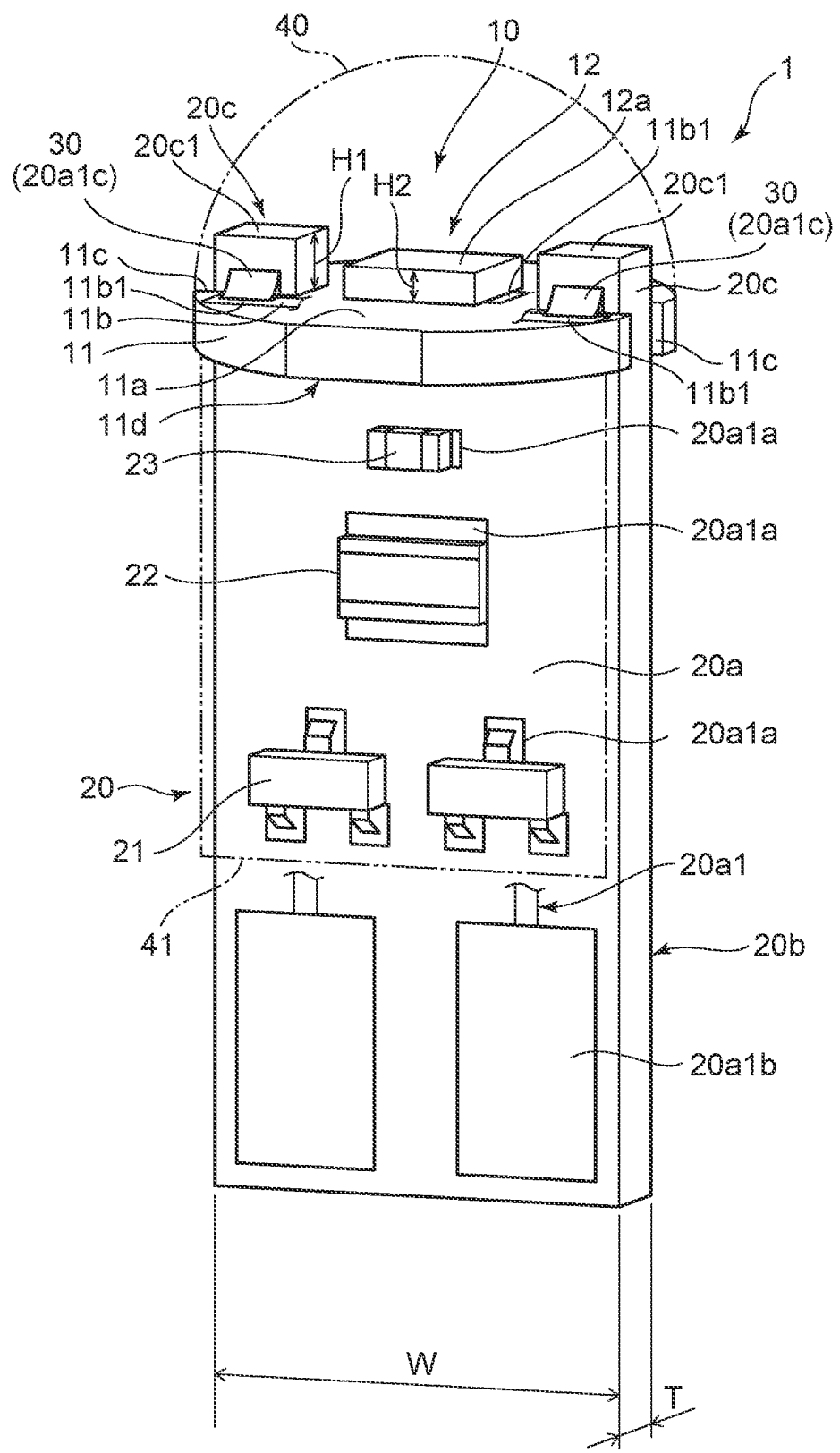
FIG. 1 is a schematic perspective view illustrating a vehicle luminaire according to an embodiment.

In general, according to one embodiment, a vehicle luminaire includes: a board having a plate shape and including a first surface, a second surface facing the first surface, and at least one coupling portion penetrating between the first surface and the second surface; a light-emitting element provided on the first surface of the board; and a connecting portion having a plate shape, including a convex portion provided inside each coupling portion on one end portion side, and extending in a direction from the first surface toward the second surface. A tip portion of the convex portion protrudes from the first surface of the board. A distance between the tip portion of the convex portion and the first surface of the board is larger than a distance between a light-emitting surface of the light-emitting element and the first surface of the board.

Hereinafter, an embodiment is described with reference to the drawings. In the drawings, the same components are denoted by the same reference numerals, and a detailed description thereof will be omitted as appropriate.

Examples of a vehicle luminaire 1 according to the present embodiment include a luminaire used for a room lamp, a meter lamp, a reading lamp, a brake lamp, a direction indicator lamp, a tail lamp, or the like provided in an automobile, a railway vehicle, or the like. However, a use of the vehicle luminaire 1 is not limited thereto.

(Vehicle Luminaire)

FIG. 1 is a schematic perspective view illustrating the vehicle luminaire 1 according to the present embodiment.

As illustrated in FIG. 1, the vehicle luminaire 1 includes, for example, a light-emitting portion 10, a connecting portion 20, and a bonding portion 30.

The light-emitting portion 10 is provided with, for example, a board 11 and a light-emitting element 12.

The board 11 has a plate shape. A planar shape of the board 11 can be, for example, a part of a circle including a center point. However, the planar shape of the board 11 is not limited to the illustrated one. The planar shape of the board 11 can be, for example, a polygon. The planar shape of the board 11 can be appropriately changed according to the number, arrangement, and the like of the light-emitting elements 12.

The board 11 can be formed of an insulating material. The board 11 can be made of, for example, an inorganic material such as ceramics (for example, aluminum oxide or aluminum nitride), an organic material such as paper phenol or glass epoxy, or the like. The board 11 may be a metal core board or the like in which a surface of a metal plate is coated with an insulating material.

When the amount of heat generated by the light-emitting element 12 is large, it is preferable to form the board 11 using a material having high thermal conductivity from a viewpoint of heat radiation. Examples of the material having high thermal conductivity include ceramics such as aluminum oxide and aluminum nitride, a high thermal conductivity resin, and a metal core board. The high thermal conductive resin can be, for example, a resin such as polyethylene terephthalate (PET) or nylon mixed with a filler made of aluminum oxide, carbon (carbon), or the like.

A thickness of the board 11 can be, for example, about 0.5 mm to 3.0 mm. However, the thickness of the board 11 is not limited to the one illustrated, and can be changed as appropriate.

The board 11 has a surface 11a (corresponding to an example of the first surface) and a surface 11d facing the surface 11a (corresponding to an example of the second surface). Wiring patterns 11b are provided on the surface 11a. Each wiring pattern 11b includes a mounting pad 11b1. The light-emitting element 12 is electrically connected to the mounting pad 11b1. The wiring patterns 11b can be formed of a low-resistance metal such as copper, aluminum, or silver.

The board 11 can be provided with a coupling portion 11c. For example, a pair of coupling portions 11c can be provided. The pair of coupling portions 11c can be provided at positions that are point-symmetrical with respect to the center point of the board 11. The coupling portions 11c penetrate between the surface 11a and the surface 11d. As illustrated in FIG. 1, the coupling portions 11c can be further opened in a side surface of the board 11. That is, the coupling portions 11c can be holes, or can also be recesses that open in main surfaces and side surfaces on both sides of the board 11.

At least one light-emitting element 12 can be provided. The light-emitting element 12 is provided on the surface 11a of the board 11. As viewed from a direction perpendicular to the surface 11a of the board 11, for example, the light-emitting element 12 can be provided at the center of a surface 11a.

The light-emitting element 12 can be, for example, a light-emitting diode, an organic light-emitting diode, a laser diode, or the like.

The light-emitting element 12 can be, for example, a surface-mounted light-emitting element such as a plastic leaded chip carrier (PLCC). The light-emitting element 12 can be, for example, a light-emitting element including a lead wire of a shell shape or the like. The light-emitting element 12 illustrated in FIG. 1 is the surface-mounted light-emitting element.

The light-emitting element 12 may be mounted by a chip on board (COB). When the light-emitting element 12 is mounted by the COB, the light-emitting element 12 having a chip-shaped, a wiring that electrically connects the light-emitting element 12 and the wiring patterns 11b, a frame-shaped member that surrounds the light-emitting element 12 and the wiring, a sealing portion that is provided inside the frame-shaped member and covers the light-emitting element 12 and the wiring, and the like can be provided on the surface 11a of the board 11. The sealing portion may include a phosphor. The phosphor can be, for example, a YAG-based phosphor (yttrium-aluminum-garnet-based phosphor). A type of the phosphor is not limited to those illustrated. The type of the phosphor can be appropriately changed so as to obtain a desired emission color in accordance with the use of the vehicle luminaire 1 or the like.

The light-emitting surface 12a of the light-emitting element 12 can be substantially parallel to the surface 11a of the board 11. For example, the light-emitting element 12 mainly emits light in a direction perpendicular to the surface 11a of the board 11.

The number, size, arrangement, and the like of the light-emitting element 12 are not limited to those illustrated, and can be appropriately changed according to the size, the use, and the like of the vehicle luminaire 1. When a plurality of light-emitting elements 12 are provided, the plurality of light-emitting elements 12 can be connected in series with each other.

The connecting portion 20 has a plate shape. A planar shape of the connecting portion 20 can be, for example, a substantially rectangular shape. The connecting portion 20 extends from the surface 11a of the board 11 toward the surface 11d.

Convex portions 20c can be provided at the end portions of the connecting portion 20 on the board 11 side. A thickness of each convex portion 20c can be the same as a thickness T of the connecting portion 20. For example, convex portions 20c can be formed by cutting out the vicinity of the end portions of the connecting portion 20 on the board 11 side. Convex portions 20c can be provided at positions on the board 11 corresponding to the coupling portions 11c. The number of convex portions 20c is the same as the number of coupling portions 11c, that is, two convex portions 20c can be provided.

As illustrated in FIG. 1, the convex portions 20c are provided inside the coupling portions 11c. By providing the convex portions 20c inside the coupling portions 11c, the connecting portion 20 and the board 11 can be aligned and the connecting portion 20 and the board 11 can be coupled to each other. For example, the convex portions 20c can be bonded to an inner wall of the coupling portions 11c or press-fitted to the coupling portions 11c.

That is, the connecting portion 20 includes convex portions 20c provided inside the coupling portions 11c on end portion sides.

As illustrated in FIG. 1, tip portions 20c1 of the convex portions 20c protrude from the surface 11a of the board 11. When the tip portions 20c1 of the convex portions 20c protrude from the surface 11a of the board 11, an external force or the like can be prevented from being applied to the light-emitting surface 12a of the light-emitting element 12.

Details regarding effects of the convex portions 20c will be described later.

In order to facilitate replacement with the wedge-based bulb of the related art, a width dimension W of the connecting portion 20 can be 5.0 mm to 15.0 mm, for example, about 10.0 mm. The width dimension W is a dimension of the connecting portion 20 in a direction orthogonal to a direction in which the vehicle luminaire 1 is inserted into a socket 101.

The thickness T of the connecting portion 20 can be 0.5 mm to 3.0 mm, for example, about 2.0 mm. However, the width dimension W and the thickness T of the connecting portion 20 are not limited to those illustrated, and can be appropriately changed according to a dimension of a recess of the socket 101 into which the connecting portion 20 is inserted.

A material of the connecting portion 20 can be, for example, the same as the material of the board 11 described above. The heat generated in the light-emitting element 12 is transmitted to the connecting portion 20 via the board 11, and is emitted to an outside from the connecting portion 20 via the socket 101. Therefore, in consideration of suppressing the temperature rise of the light-emitting element 12, it is preferable to form the connecting portion 20 using a material having high thermal conductivity. Examples of the material having high thermal conductivity include ceramics such as aluminum oxide and aluminum nitride, a high thermal conductivity resin, and a metal core board. In this case, the material of the connecting portion 20 may be the same as or different from the material of the board 11.

A wiring pattern 20a1 can be provided on a surface 20a of the connecting portion 20. The wiring pattern 20a1 can be formed of a low-resistance metal such as copper, aluminum, or silver. The wiring pattern 20a1 includes, for example, mounting pads 20a1a, terminals 20a1b, and connection pads 20a1c.

The mounting pads 20a1a can be provided in a central region of the surface 20a. Circuit components are mounted on the mounting pads 20a1a. For example, as illustrated in FIG. 1, the circuit components can be diodes 21, a resistor 22, a capacitor 23, or the like.

Since the wedge base bulb is an incandescent lamp, any one of a pair of leads may be electrically connected to a positive side of a power supply, and the other lead may be electrically connected to a negative side of the power supply. That is, the wedge base bulb has no polarity. On the other hand, the light-emitting element 12 such as a light-emitting diode has a polarity. Therefore, a diode can be provided to prevent a reverse voltage from being applied to the light-emitting element 12.

In consideration of replacement with the wedge base bulb, it is preferable to provide a nonpolar circuit in the vehicle luminaire 1. If the nonpolar circuit is provided in the vehicle luminaire 1, a direction of attachment to the socket 101 is lost as in the case of the wedge base bulb. Therefore, a mounting operation of the vehicle luminaire 1 is facilitated.

For example, if a bridge circuit (bridge diode) is configured using four diodes, the nonpolar circuit can be provided in the vehicle luminaire 1. The diode 21 illustrated in FIG. 1 is a so-called two-element diode. If the diode 21 is a two-element diode, the bridge circuit can be configured by using two diodes 21, so that the mounting area thereof can be reduced. Therefore, the width dimension W of the connecting portion 20 can be easily matched with a width dimension of a portion where a lead of the wedge base bulb is provided.

The resistor 22 can be, for example, a surface-mounted resistor, a resistor including a lead wire (metal oxide film resistor), a film-shaped resistor formed by using a screen printing method, or the like. The resistor 22 illustrated in FIG. 1 is the surface-mounted resistor. If the resistor 22 is the surface-mounted resistor, the mounting area thereof can be reduced, so that the width dimension W of the connecting portion 20 can be easily matched with the width dimension of the portion where the lead of the wedge base bulb is provided.

Here, since forward voltage characteristics of the light-emitting element 12 vary, when a voltage applied between an anode terminal and a ground terminal is constant, the brightness (luminous flux, brightness, luminous intensity, and illuminance) of the light emitted from the light-emitting element 12 varies. Therefore, a value of a current flowing through the light-emitting element 12 is within a predetermined range due to the resistor 22 so that the brightness of the light emitted from the light-emitting element 12 falls within a predetermined range. In this case, a resistance value of the resistor 22 is changed so that the value of the current flowing through the light-emitting element 12 is within the predetermined range.

When the resistor 22 is the surface-mounted resistor or the resistor including the lead wire, the resistor 22 having an appropriate resistance value is selected according to the forward voltage characteristics of the light-emitting element 12. When the resistor 22 is the film-shaped resistor, the resistance value thereof can be increased if a part of the resistor 22 is removed.

The resistor 22 may further have a function of preventing an excessive current from flowing through the light-emitting element 12.

The number, size, arrangement, and the like of the resistors 22 are not limited to those illustrated, and can be appropriately changed according to the number, specifications, and the like of the light-emitting elements 12.

The capacitor 23 can be provided, for example, for noise suppression and for smoothing a voltage. The capacitor 23 may be, for example, a surface-mounted capacitor 23. If the capacitor 23 is the surface-mounted capacitor 23, the mounting area thereof can be reduced, so that the width dimension W of the connecting portion 20 can be easily matched with the width dimension of the portion where the lead of the wedge base bulb is provided.

The number, size, arrangement, and the like of the diode 21, the resistor 22, and the capacitor 23 are not limited to those illustrated. For example, at least a part of these elements can be provided on a surface 20*b* of the connecting portion 20 facing the surface 20*a*. In this case, a wiring pattern can be provided on the surface 20*b*, and at least a part of these elements can be electrically connected to the wiring pattern. A conduction via that penetrates the connecting portion 20 in a thickness direction is provided, and the wiring pattern 20*a*1 provided on the surface 20*a* and the wiring pattern provided on the surface 20*b* can be electrically connected by the conduction via.

At least a part of these elements can be provided on the surface 11*d* of the board 11 facing the surface 11*a*. In this case, a wiring pattern can be provided on the surface 11*b*, and at least a part of these elements can be electrically connected to the wiring pattern. A conduction via that penetrates the board 11 in a thickness direction is provided, and the wiring patterns 11*b* provided on the surface 11*a* and the wiring pattern provided on the surface 11*d* can be electrically connected by the conduction via.

The circuit components are not limited to those illustrated. For example, the circuit components may be a passive element or an active element used for forming a light-emitting circuit including the light-emitting element 12. For example, the circuit components may be a pull-down resistor, a positive characteristic thermistor, a negative characteristic thermistor, an inductor, a surge absorber, a varistor, a transistor such as an FET or a bipolar transistor, a Zener diode, an integrated circuit, an arithmetic element, or the like, in addition to the circuit components described above. The integrated circuit may include, for example, at least one of a blinking circuit, a constant current circuit, and a lighting circuit (drive circuit).

The circuit components can be provided in a housing 102 of a vehicle lamp 100 to which the vehicle luminaire 1 is mounted. In this way, since the configuration of the vehicle luminaire 1 can be simplified, the size and cost of the vehicle luminaire 1 can be reduced. However, if the circuit components are provided in the vehicle luminaire 1, even if the socket to which the wedge base bulb is mounted is used directly, the vehicle luminaire 1 can be protected and multifunctional.

A pair of terminals 20*a*1*b* are provided in the vicinity of an end portion of the connecting portion 20 on an opposite side from the board 11 side. When the connecting portion 20 is mounted to the socket 101, the pair of terminals 20*a*1*b* are electrically connected to socket terminals 101*a* and 101*b* provided in the socket 101. In this case, by bringing the socket terminal (one socket terminal) 101*a* provided in the socket 101 into contact with the terminal (one terminal) 20*a*1*b*, the socket terminal 101*a* can be electrically connected to an electrode of the corresponding polarity (one polarity) of the light-emitting element 12 via the wiring patterns 20*a*1 and the wiring patterns 11*b*. The socket terminal 101*b* (the other socket terminal) can be electrically connected to an electrode of the corresponding polarity (the other polarity) of the light-emitting element 12 via the wiring patterns 20*a*1 and the wiring patterns 11*b*.

The terminals 20*a*1*b* can also be provided on the surface 20*b* of the connecting portion 20. The terminal 20*a*1*b* provided on the surface 20*b* can be provided at a position facing the terminal 20*a*1*b* provided on the surface 20*a*. The terminal 20*a*1*b* provided on the surface 20*b* can be electrically connected to the terminal 20*a*1*b* provided on the surface 20*a* via the conduction via. If the terminal 20*a*1*b* is also provided on the surface 20*b*, the reliability regarding the electrical connection with the socket terminals 101*a* and 101*b* provided on the socket 101 can be improved.

The connection pads 20*a*1*c* can be provided on the convex portions 20*c*. The connection pads 20*a*1*c* can be provided on at least one of a surface of the convex portions 20*c* on the surface 20*a* side and a surface of the convex portions 20c on the surface 20b side. For example, the connection pad 20a1c provided on a surface of the convex portion 20c on the surface 20b side can be electrically connected to the connection pad 20a1c provided on a surface of the convex portion 20c on the surface 20a side via the conduction via or the like.

At least a part of the connection pads 20a1c can be provided at a position protruding from the surface 11a of the board 11.

The bonding portions 30 electrically connect a portion of the connection pads 20a1c protruding from the surface 11a of the board 11 and the wiring patterns 11b provided on the surface 11a of the board 11. That is, the bonding portions 30 electrically connect the wiring patterns 11b of the board 11 and the wiring patterns 20a1 of the connecting portion 20. For example, the bonding portions 30 can be formed using a metal having a low melting point such as solder. For example, the bonding portions 30 may be formed by soldering the connection pads 20a1c and the wiring patterns 11b.

In the above description, a case where the bonding portions 30 are provided on the surface 11a side of the board 11 has been illustrated, but arrangement positions of the bonding portions 30 are not limited thereto.

Figure 2:
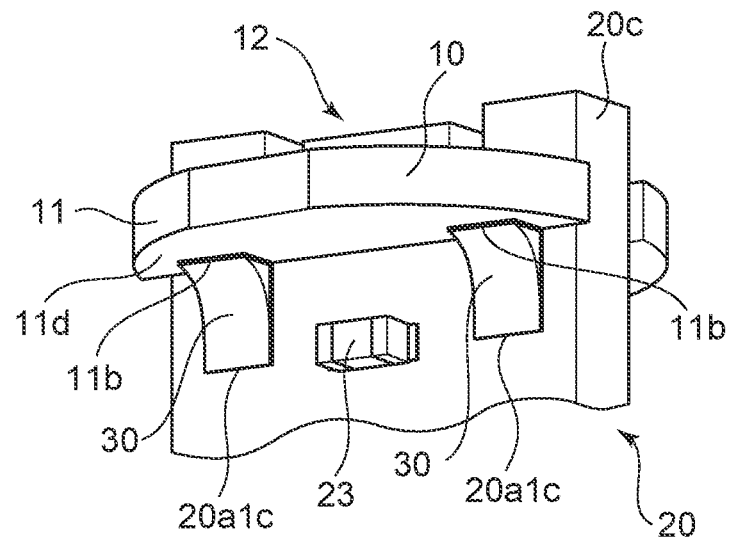
FIG. 2 is a schematic perspective view illustrating arrangement positions of bonding portions according to another embodiment.

FIG. 2 is a schematic perspective view illustrating the arrangement positions of bonding portions 30 according to another embodiment.

As illustrated in FIG. 2, the bonding portions 30 can be provided on the surface 11d side of the board 11.

For example, the bonding portions 30 can connect the surface 11d of the board 11 and at least one of the connecting portion 20 and the convex portions 20c. In this case, the wiring patterns 11b provided on the surface 11d of the board 11 and the connection pads 20a1c provided on at least one of the connecting portion 20 and the convex portions 20c may be electrically connected to each other via the bonding portions 30.

Next, the effects of the convex portions 20c will be further described.

When the vehicle luminaire 1 is mounted to the socket 101 of the vehicle lamp 100, the connecting portion 20 is pushed into the socket 101. At this time, an operator grasps a peripheral edge of the board 11 and pushes the connecting portion 20 into the socket 101.

However, as shown in FIG. 1, the light-emitting element 12 is provided on the surface 11a of the board 11 on an opposite side from the connecting portion 20 side. Therefore, when the operator grasps the peripheral edge of the board 11, the operator's finger, hand, or the like may touch the light-emitting surface 12a of the light-emitting element 12. When the vehicle luminaire 1 is mounted on the socket 101, or in a manufacturing process of the vehicle luminaire 1, the vehicle luminaire 1 may fall.

In such a case, when a large force is applied to the light-emitting surface 12a of the light-emitting element 12, the light-emitting element 12 may fail. In this case, for example, a protective member surrounding the light-emitting element 12 may be provided on the surface 11a of the board 11, but if the protective member is simply provided on the surface 11a of the board 11, a manufacturing cost may increase, and the number and size of the light-emitting elements 12 may be limited.

Therefore, in the vehicle luminaire 1 according to the present embodiment, as illustrated in FIG. 1, the tip portions 20c1 of the convex portions 20c protrude from the surface 11a of the board 11. A distance H1 between the tip portion 20c1 of the convex portion 20c and the surface 11a of the board 11 is larger than a distance H2 between the light-emitting surface 12a of the light-emitting element 12 and the surface 11a of the board 11.

If the distance H1 is larger than the distance H2, the operator's finger, hand, or the like touches the tip portion 20c1 of the convex portion 20c prior to the light-emitting surface 12a of the light-emitting element 12. When the vehicle luminaire 1 is dropped or the like, a floor or the like comes into contact with the tip portion 20c1 of the convex portion 20c prior to the light-emitting surface 12a of the light-emitting element 12.

Therefore, an external force can be prevented from being applied to the light-emitting surface 12a of the light-emitting element 12. Even if the external force is applied to the light-emitting surface 12a of the light-emitting element 12, the force applied to the light-emitting surface 12a can be reduced.

Since it is not necessary to separately provide a protective member or the like surrounding the light-emitting element 12, the manufacturing cost is not increased, and the number or the size of the light-emitting element 12 is not limited.

In this case, if the distance H1 is greater than the distance H2 by 0.5 mm or more, the external force can be prevented more effectively from being applied to the light-emitting surface 12a of the light-emitting element 12. Even if the external force is applied to the light-emitting surface 12a of the light-emitting element 12, the force applied to the light-emitting surface 12a can be reduced more effectively.

However, if the distance H1 is made too large, a light emitted from the light-emitting surface 12a is likely to be incident on the tip portions 20c1 of the convex portions 20c, so that the light extraction efficiency may decrease, or a desired light distribution characteristic may not be obtained.

Figure 3:
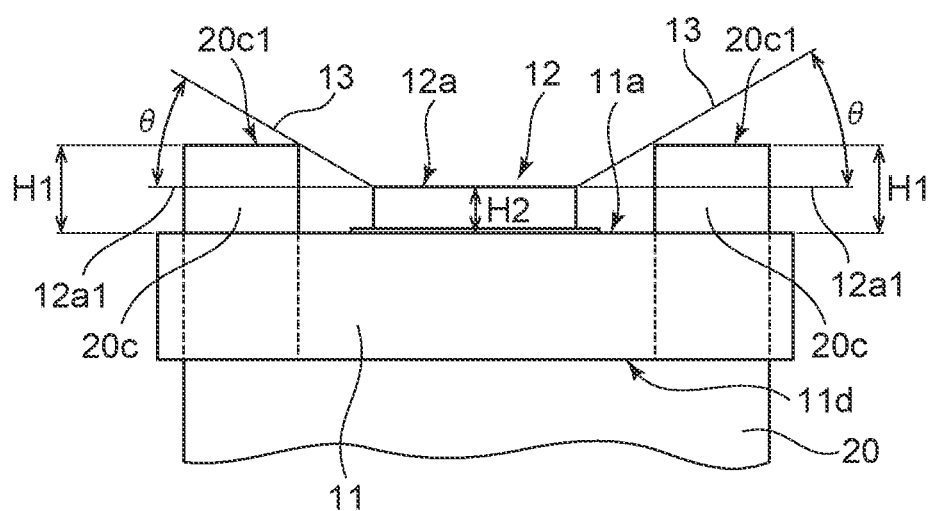
FIG. 3 is a schematic side view illustrating positional relationships between tip portions of convex portions and a light-emitting surface of a light-emitting element.

FIG. 3 is a schematic side view illustrating positional relationships between the tip portions 20c1 of the convex portions 20c and the light-emitting surface 12a of the light-emitting element 12.

As illustrated in FIG. 3, as viewed from a direction parallel to the surface 11a of the board 11, an angle θ between a line segment 13 connecting an edge of the light-emitting surface 12a and an edge of the tip portion 20c1 on the light-emitting element 12 side and an extension line 12a1 of the light-emitting surface 12a can be set to 30° or less.

That is, $0°<θ≤30°$ can be satisfied.

In this case, if the angle θ exceeds 0°, the external force can be prevented from being applied to the light-emitting surface 12a of the light-emitting element 12.

When the angle θ is 30° or less, the light emitted from the light-emitting surface 12a is less likely to be incident on the tip portions 20c1 of the convex portions 20c. Therefore, a decrease in light extraction efficiency can be reduced. The desired light distribution characteristic can be obtained.

As illustrated in FIG. 1, the vehicle luminaire 1 can further include a cover 40 and a cover 41. The cover 40 and the cover 41 may be provided as necessary.

The cover 40 can be provided on a light-emitting side of the light-emitting portion 10. For example, the cover 40 can be provided so as to cover the surface 11a of the board 11. A shape of the cover 40 can be appropriately changed in accordance with light distribution characteristics required for the vehicle luminaire 1. For example, as illustrated in FIG. 1, the cover 40 can be formed of a convex curved surface such as a hemispherical surface. In this way, the vehicle luminaire 1 having a wide light distribution characteristic can be obtained.

The shape of the cover can be appropriately changed in accordance with light distribution characteristics, optical characteristics, and the like required for the vehicle luminaire 1. For example, although the cover 40 illustrated in FIG. 1 has a convex curved surface, the cover 40 may have a concave curved surface or a flat surface. For example, the cover 40 may have a columnar shape, a conical shape, a truncated conical shape, a prismatic shape, a pyramidal shape, a truncated pyramidal shape, or the like.

Unevenness can be provided on a light-emitting surface of the cover 40 to scatter light. The cover 40 may be transparent or colored. Light scattering particles such as titanium oxide particles or a phosphor may be applied to or included in the cover 40. The cover 40 can be provided with holes. If the cover 40 is provided with the holes, air can be convected through the holes. Therefore, the light-emitting element 12 can be cooled. Since an intensity of the light emitted through the holes can be increased, the light distribution characteristics can be controlled. A film containing a material having a high light reflectance (for example, aluminum or the like) can be provided on an inner wall or an outer wall of the cover 40, and the cover 40 can have a function of a reflector.

The cover 41 can cover a region of the connecting portion 20 where circuit components such as the diode 21, the resistor 22, and the capacitor 23 are provided. In this case, a region of the connecting portion 20 where the terminals 20a1b are provided can be exposed from the cover 41. If the cover 41 is provided, an external force can be prevented from being applied to the circuit components or dust or the like can be prevented from coming into contact with the circuit components.

(Vehicle Lamp 100)

Figure 4:
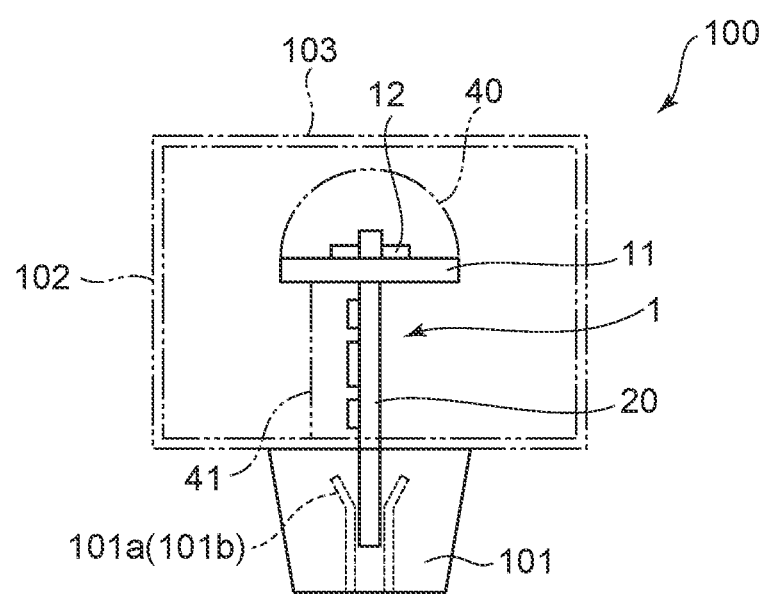
FIG. 4 is a schematic diagram illustrating a vehicle lamp according to the present embodiment.

FIG. 4 is a schematic diagram illustrating the vehicle lamp 100 according to the present embodiment.

In the following, a case where the vehicle luminaire 1 described above is provided will be illustrated as an example, but at least one vehicle luminaire 1 may be provided.

As illustrated in FIG. 4, the vehicle lamp 100 can include the vehicle luminaire 1, the socket 101, the housing 102, and a cover 103.

As illustrated in FIG. 4, the socket 101 is provided in, for example, the housing 102. The vehicle luminaire 1 is mounted on the socket 101. The socket 101 is formed of, for example, an insulating material such as a resin.

In FIG. 4, a case where the socket 101 and the housing 102 are separately provided is illustrated, but the socket 101 and the housing 102 may be integrally formed.

The socket 101 is provided with the recess opening at one end portion. The vehicle luminaire 1 (the connecting portion 20) is inserted into the recess. A pair of socket terminals 101a corresponding to one voltage polarity (for example, positive) and a pair of socket terminals 101b corresponding to the other voltage polarity (for example, negative) are provided inside the recess. As described above, if the vehicle luminaire 1 is provided with the nonpolar circuit, a mounting direction of the vehicle luminaire 1 (the connecting portion 20) is not limited.

The pair of socket terminals 101a (101b) can be elastically deformed. When the connecting portion 20 is inserted into the recess, the socket terminals 101a and 101b come into contact with the terminals 20a1b of the connecting portion 20, respectively. A power supply or the like provided outside the vehicle lamp 100 is electrically connected to the pair of socket terminals 101a (101b). A circuit board may be provided in at least one of an inside and an outer surface of the housing 102, and the pair of socket terminals 101a (101b) and the power supply or the like may be electrically connected to each other via the circuit board.

A shape of the housing 102 can be, for example, a box shape in which one end portion side thereof is open. The housing 102 is formed of, for example, a resin that does not transmit light.

The cover 103 can be provided so as to close the opening of the housing 102. The cover 103 can be formed of a translucent resin or the like. The cover 103 can have a function of a lens or the like, or can suppress glare. The cover 103 can be provided on the housing 102 in an openable and closable manner or in a detachable manner.

In addition, an optical element such as a reflector or a lens can be provided inside the housing 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A vehicle luminaire, comprising:
   a board having a plate shape and including a first surface, a second surface facing an opposite direction as the first surface, and a pair of coupling portions penetrating between the first surface and the second surface;
   a light-emitting element provided on the first surface of the board; and
   a connecting portion having a plate shape, including a pair of convex portions provided at an end portion of the board side, each of the pair of convex portions provided inside each of the pair of coupling portions, and extending in a direction from the first surface toward the second surface,
   each tip portion of the pair of convex portions protruding from the first surface of the board, and
   a distance between each tip portion of the pair of convex portions and the first surface of the board being larger than a distance between a light-emitting surface of the light-emitting element and the first surface of the board,
   the light-emitting element located between the pair of convex portions on the first surface of the board,
   wherein as viewed from a direction perpendicular to an axis that passes through a center of the first surface of the board and is perpendicular to the first surface, when an angle between a line segment connecting an edge of the light-emitting surface of the light-emitting element and an edge of the tip portion of one of the pair of convex portions on the light-emitting element side and an extension line of the light-emitting surface of the light-emitting element is $\theta$, an expression of $0°<\theta\leq30°$ is satisfied.

2. The luminaire according to claim 1, wherein
   the light-emitting element is provided at a center of the first surface as viewed from a direction parallel to an axis that passes through the center of the first surface of the board and is perpendicular to the first surface.

3. The luminaire according to claim 1, wherein
   the plate shape of the board is a part of a circle including a center point.

4. The luminaire according to claim 1, wherein
the pair of coupling portions are provided at positions that are point-symmetrical with respect to the center point of the board.
5. The luminaire according to claim 1, wherein
the pair of coupling portions further open in a side surface of the board.
6. The luminaire according to claim 1, wherein
a thickness of one of the pair of convex portions is the same as a thickness of the connecting portion.
7. The luminaire according to claim 1, wherein
a wiring pattern having a pair of terminals is provided on a surface of the connecting portion, and
the pair of terminals are provided in a vicinity of an end portion of the connecting portion on an opposite side from the board side.
8. The luminaire according to claim 7, wherein
two two-element diodes are electrically connected to the wiring pattern.
9. The luminaire according to claim 8, wherein
the two two-element diodes constitute a bridge circuit.
10. The luminaire according to claim 7, wherein
a resistor is electrically connected to the wiring pattern.
11. The luminaire according to claim 10, wherein
the resistor is at least one of a surface-mounted resistor, a resistor including a lead wire, and a film-shaped resistor.
12. The luminaire according to claim 7, wherein
a capacitor is electrically connected to the wiring pattern.
13. The luminaire according to claim 7, wherein
the wiring pattern further includes a connection pad, and
the connection pad is provided on one of the pair of convex portions.
14. The luminaire according to claim 13, wherein
the connection pad is electrically connected to the light-emitting element.
15. The luminaire according to claim 1, wherein
the light-emitting element is a surface-mounted light-emitting element.
16. The luminaire according to claim 15, wherein
the light-emitting surface of the light-emitting element is substantially parallel to the first surface of the board.
17. A vehicle lamp, comprising:
the vehicle luminaire according to claim 1; and
a socket into which the connecting portion provided in the vehicle luminaire is inserted.

* * * * *